United States Patent
Egami et al.

(10) Patent No.: US 11,254,580 B2
(45) Date of Patent: Feb. 22, 2022

(54) SILICA PARTICLE LIQUID DISPERSION AND PRODUCTION METHOD THEREFOR

(71) Applicant: JGC CATALYSTS AND CHEMICALS LTD., Kanagawa (JP)

(72) Inventors: Miki Egami, Fukuoka (JP); Mitsuaki Kumazawa, Fukuoka (JP); Hirotada Arakane, Fukuoka (JP); Ryo Muraguchi, Fukuoka (JP); Toshiharu Hirai, Kanagawa (JP)

(73) Assignee: JGC CATALYSTS AND CHEMICALS LTD., Kanagawa (JP)

( * ) Notice: Subject to any disclaimer, the term of this patent is extended or adjusted under 35 U.S.C. 154(b) by 329 days.

(21) Appl. No.: 16/478,600

(22) PCT Filed: Jan. 18, 2018

(86) PCT No.: PCT/JP2018/001403
§ 371 (c)(1),
(2) Date: Jul. 17, 2019

(87) PCT Pub. No.: WO2018/135585
PCT Pub. Date: Jul. 26, 2018

(65) Prior Publication Data
US 2019/0359491 A1   Nov. 28, 2019

(30) Foreign Application Priority Data
Jan. 20, 2017   (JP) .............................. JP2017-008999

(51) Int. Cl.
C01B 33/145 (2006.01)
C01B 33/141 (2006.01)
C09K 3/14 (2006.01)

(52) U.S. Cl.
CPC .......... C01B 33/145 (2013.01); C01B 33/141 (2013.01); C01P 2004/60 (2013.01); C09K 3/14 (2013.01)

(58) Field of Classification Search
CPC . C01B 33/145; C01B 33/141; C01P 2004/60; C09K 3/14; C09K 3/1463;
(Continued)

(56) References Cited

U.S. PATENT DOCUMENTS

2011/0209413 A1    9/2011   Nishida et al.
2014/0057107 A1*   2/2014   Zenitani .................... C09C 1/30
                                                           428/402

FOREIGN PATENT DOCUMENTS

JP    H11-060232    3/1999
JP    2003-133267   5/2003
(Continued)

OTHER PUBLICATIONS

Office Action issued in Japanese Patent Application No. 2018-006498, dated Jul. 30, 2021, English translation.
(Continued)

*Primary Examiner* — Anthony J Zimmer
(74) *Attorney, Agent, or Firm* — Greenblum & Bernstein, P.L.C.

(57) ABSTRACT

A method for producing a liquid dispersion containing irregular-shaped silica particles in which two or more primary particles are linked together, by simultaneously adding a liquid A containing silane alkoxide and a liquid B containing an alkali catalyst and water to a liquid I consisting substantially of an organic solvent to cause hydrolysis and polycondensation of the silane alkoxide, wherein the period from the start of the addition until the silica concentration of the reaction system at the end of the addition reaches 70% is 20% or less of the full reaction time period.

17 Claims, 6 Drawing Sheets

(58) Field of Classification Search
CPC ..... C09K 3/1454; B24B 37/00; H01L 21/304; C09G 1/02
See application file for complete search history.

(56) References Cited

FOREIGN PATENT DOCUMENTS

| | | |
|---|---|---|
| JP | 2004-203638 | 7/2004 |
| JP | 2005-060217 | 3/2005 |
| JP | 2009-149493 | 7/2009 |
| JP | 2009-155180 | 7/2009 |
| JP | 2012-156393 | 8/2012 |
| JP | 2014-154707 | 8/2014 |
| JP | 2015-124231 | 7/2015 |
| WO | 2004/074180 | 9/2004 |

OTHER PUBLICATIONS

International Search Report in International Patent Application No. PCT/JP2018/001403, dated Mar. 6, 2018.
International Preliminary Report on Patentability for International Patent Application No. PCT/JP2018/001403, dated Jul. 23, 2019.

\* cited by examiner

[FIG. 1]
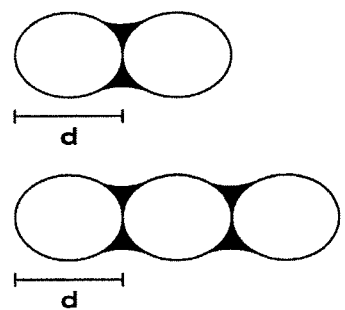
[FIG. 2]
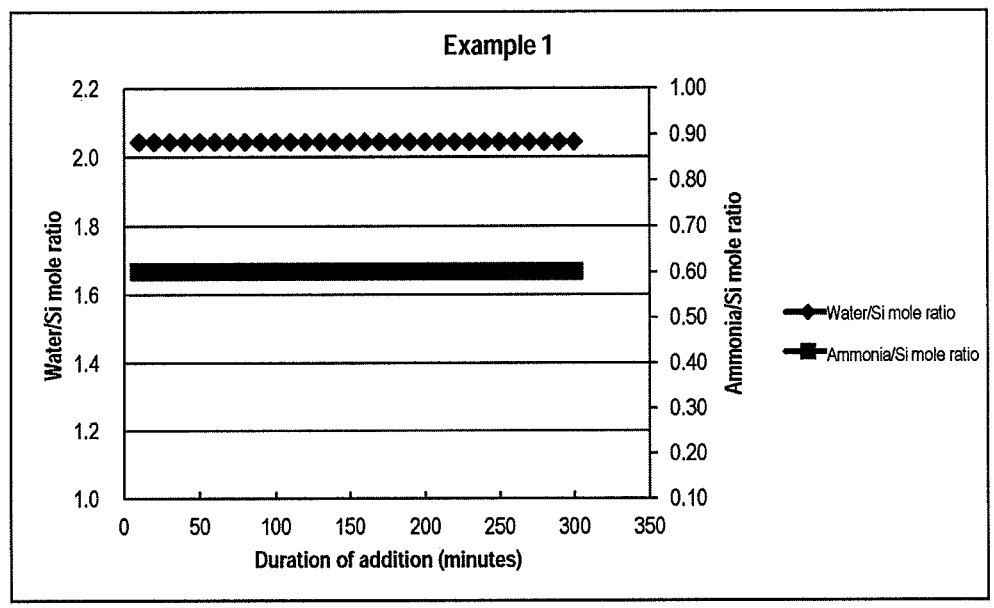

[FIG. 3]
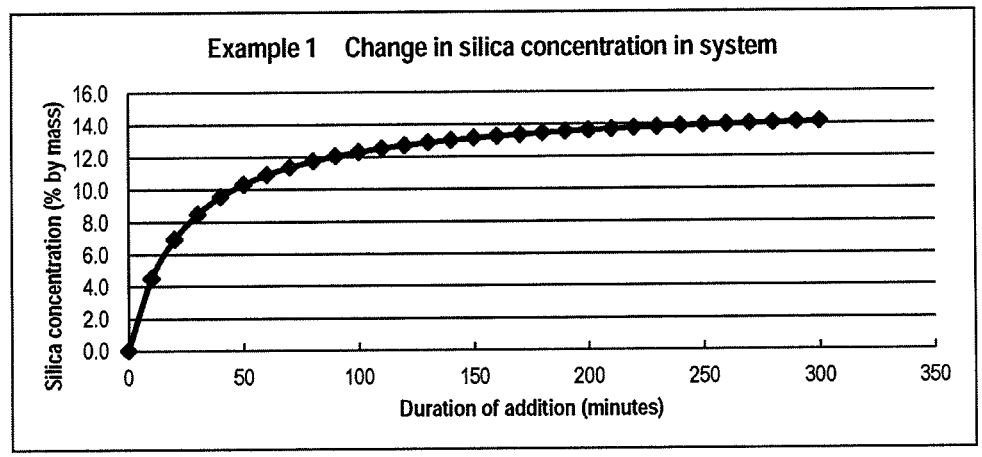
[FIG. 4]
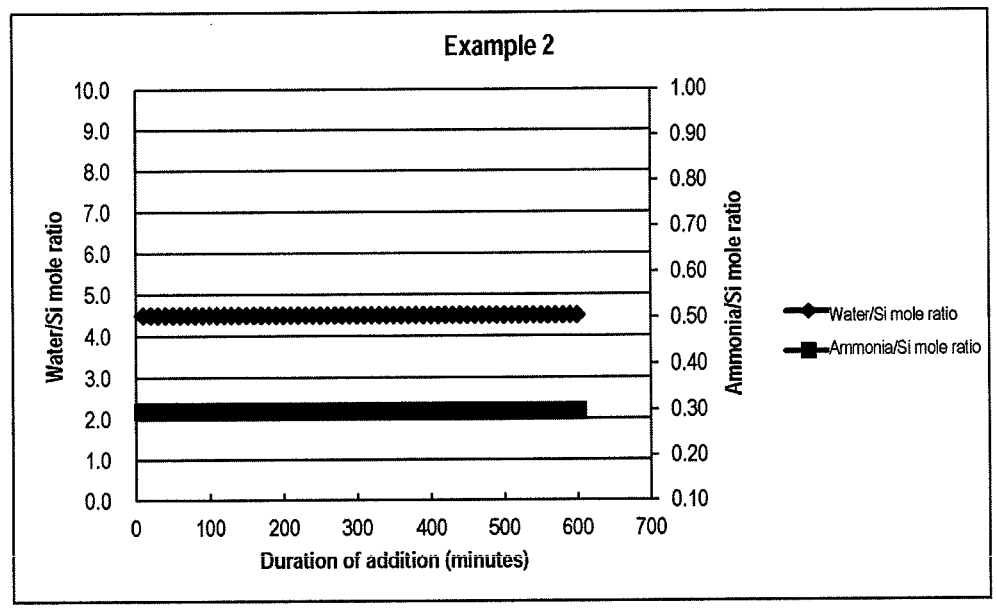

[FIG. 5]
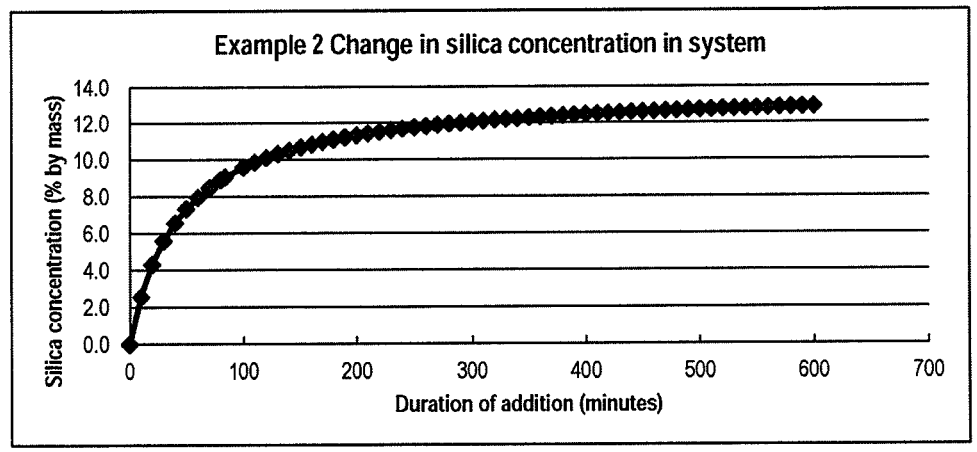
[FIG. 6]
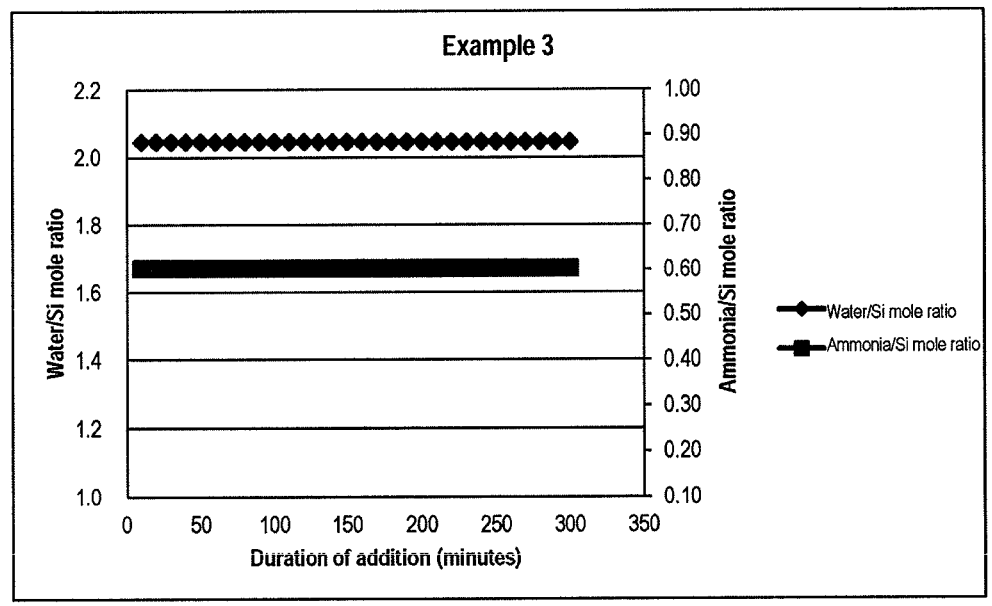

[FIG. 7]
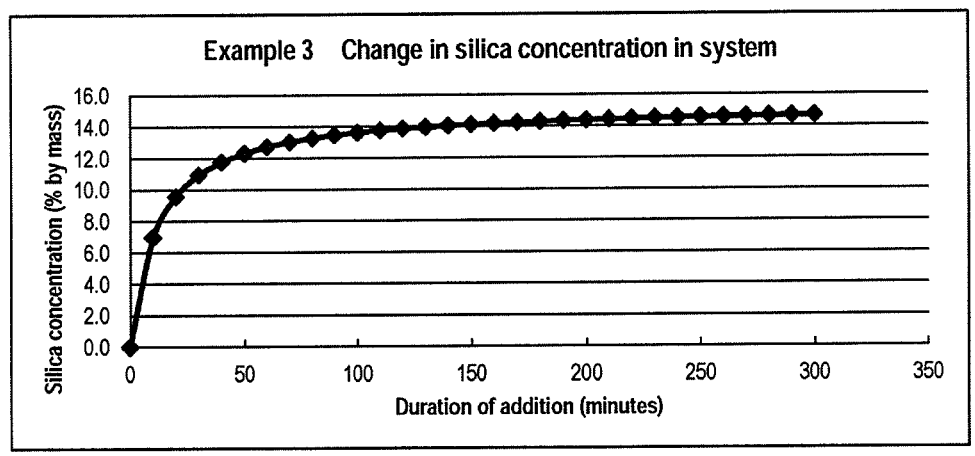
[FIG. 8]
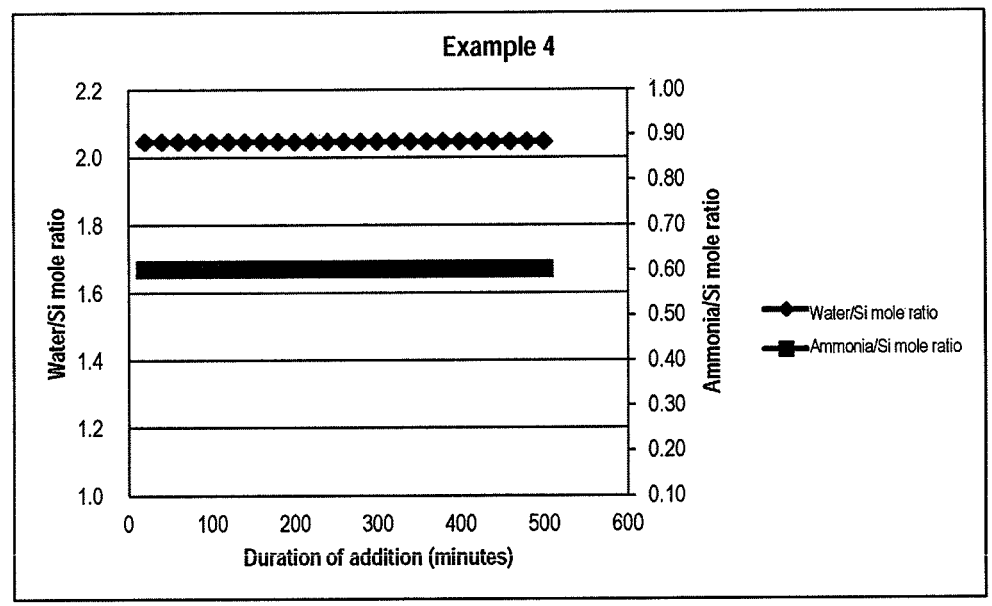

[FIG. 9]
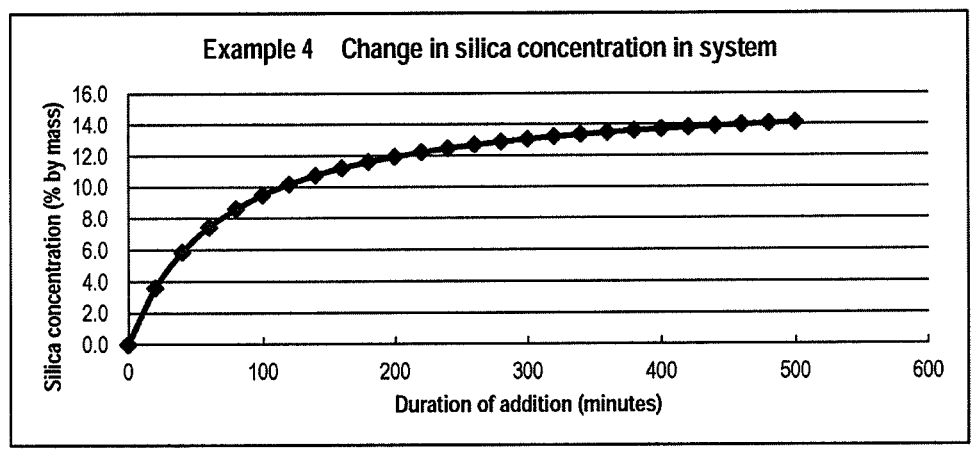
[FIG. 10]
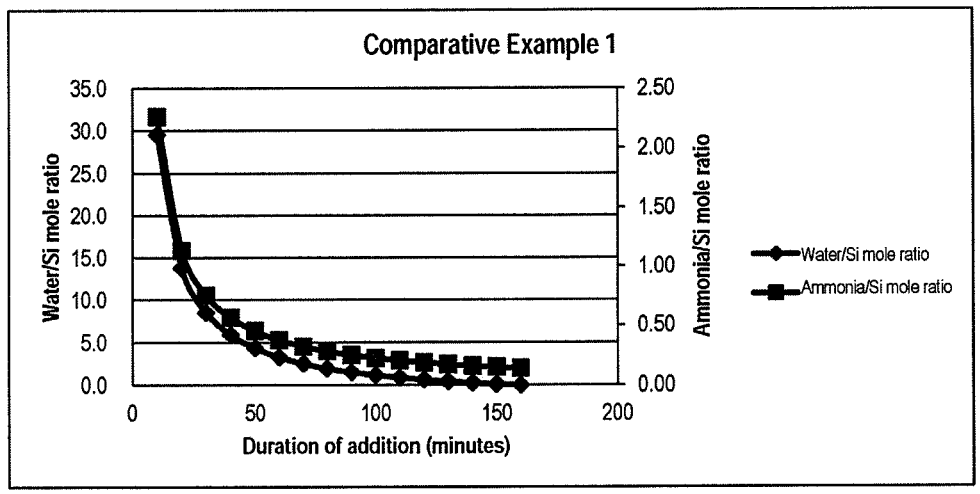

[FIG. 11]
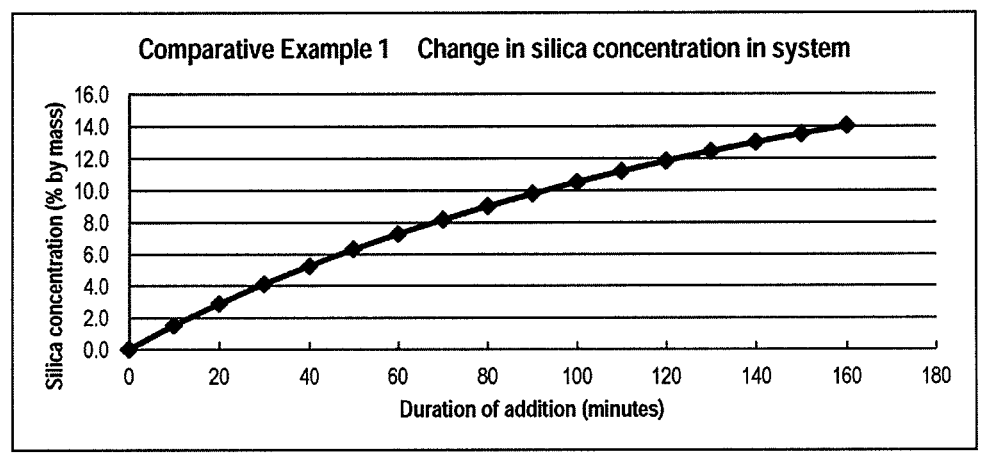

SILICA PARTICLE LIQUID DISPERSION AND PRODUCTION METHOD THEREFOR

TECHNICAL FIELD

The present invention relates to a method for producing a dispersion liquid of irregular-shaped silica particles and particularly to a method for producing a dispersion liquid comprising irregular-shaped silica particles useful for an abrasive used in polishing during formation of a metal wiring layer on a semiconductor integrated circuit, etc.

BACKGROUND ART

Various integrated circuits are used for computers and various electronic devices. As they are downsized and become sophisticated, higher density and higher performance have been required for circuits.

To produce a semiconductor integrated circuit, for example, an interlayer film (insulating film) is formed on a substrate such as a silicon wafer, a groove pattern for a metal wiring is formed on the interlayer film (insulating film), a barrier metal layer of tantalum nitride (TaN) or the like is formed by a sputtering method or the like, as necessary, and then a copper film for a metal wiring is formed by a chemical vapor deposition (CVD) method or the like. Here, when a barrier metal layer of TaN or the like is provided, the barrier metal layer can prevent, for example, lowering of the insulation properties of the interlayer insulating film in association with the diffusion of copper or an impurity or the like to the interlayer insulating film and erosion of the interlayer insulating film, and can enhance the adhesion between the interlayer insulating film and copper.

Subsequently, a film of unnecessary copper and barrier metal (occasionally referred to as "sacrifice layer") formed on a portion out of the groove is removed by polishing with a chemical-mechanical polishing (CMP) method and the upper surface is flattened to the maximum extent possible, and thus a wiring/circuit pattern of copper is formed by leaving a metal film only in the groove.

The abrasive used in the CMP method is typically produced by adding an oxidant for increasing the polishing speed of a wiring/circuit metal and an additive such as organic acid to a dispersion liquid comprising spherical polishing particles consisting of a metal oxide such as silica and having an average particle diameter of about 5 to 300 nm.

When incompletely reacted materials (by-products) such as oligomers of silane alkoxide are present in the dispersion liquid (silica sol) comprising the polishing particles, the silica sol has not had a sufficient stability, presumably due to the influence of the incompletely reacted materials such as highly reactive oligomers. Further, thickening, aggregation, white turbidity, generation of a sedimentary gel, etc., sometimes have occurred due to the influence of additives mixed to the dispersion liquid when used as an abrasive. Use of such an abrasive sometimes has resulted in appearance of scratches due to aggregates and has caused a problem by silica components remaining on a substrate after polishing (e.g., see Patent Literatures 1, 2, and 3). Furthermore, in some cases, the silica sol has adsorbed an additive for enhancing the abrasive property, resulting in reduction in the effect of the additive.

As a method for producing a silica sol in which the generation of incompletely reacted materials such as such oligomers is suppressed, for example, proposed is a method which comprises (a) a step of adding an organic solvent containing tetramethoxysilane and a solvent containing an alkali catalyst and water to an organic solvent containing an alkali catalyst and water to cause hydrolysis and polycondensation of tetramethoxysilane, so as to produce a silica sol; and (b) a step of heating a dispersion medium of the silica sol to a boiling point of water to substitute with water (see Patent Literature 4).

On the other hand, truly spherical and irregular-shaped silica particles are produced as a silica particle used as an abrasive. The irregular-shaped silica particles are suitably used for an abrasive emphasizing a polishing speed.

For example, the method described in Patent Literature 4 produces irregular-shaped silica particles in which the average particle diameter of a secondary particle is 1.5 to 3.0 times the average particle diameter of a primary particle diameter.

As another method for producing an irregular-shaped silica particle is also proposed a method in which methyl silicate or a mixture of methyl silicate and methanol is dropped under stirring for 10 to 40 minutes into a mixed solvent consisting of water, methanol and ammonia, or water, methanol, ammonia and an ammonium salt with the content of an ammonium ion in the solvent being 0.5 to 3% by weight based on the total weight of the solvent so that the reaction is performed at a temperature of 10 to 30° C., to cause methyl silicate to react with water (see Patent Literature 5). This method can produce a colloidal silica having a short diameter of 10 to 200 nm and a "long diameter/short diameter ratio" of 1.4 to 2.2.

A method for producing a peanut-like twin colloidal silica particle is also proposed in which a tetraalkoxysilane or a mixture of a tetraalkoxysilane and a water-miscible organic solvent as a raw material is continuously added into an aqueous solvent containing an ammonium ion to cause hydrolysis and condensation of the tetraalkoxysilane, while controlling the total addition amount of the raw materials in the range of 2.0 to 6.0 times the addition amount of the raw materials required for coalescence of two single silica particles in the initial stage of the reaction (see Patent Literature 6).

A method for producing a cocoon-type colloidal silica is further proposed in which a condensate of an alkoxysilane or a solution thereof in an aqueous solvent is dropped into an aqueous solution of ammonia or an ammonium salt, or an aqueous solution containing ammonia or an ammonium salt and an aqueous solvent while causing hydrolysis of the alkoxysilane (see Patent Literature 7).

CITATION LIST

Patent Literature

Patent Literature 1: Japanese Patent Laid-Open No. 2015-124231, paragraphs [0002] and [0006]

Patent Literature 2: Japanese Patent Laid-Open No. 2012-156393, paragraph [0006]

Patent Literature 3: Japanese Patent Laid-Open No. 2014-154707, paragraph [0007]

Patent Literature 4: Japanese Patent Laid-Open No. 2005-060217

Patent Literature 5: Japanese Patent Laid-Open No. 11-060232

Patent Literature 6: Japanese Patent Laid-Open No. 2004-203638

Patent Literature 7: International Publication No. WO 2004/074180

SUMMARY OF INVENTION

Technical Problem

The method described in Patent Literature 4 produces a highly-pure silica particle in a good productivity but, in step (a), generates incompletely reacted materials such as oligomers of silane alkoxide which do not grow to silica particles which are intended to be produced thus requires step (b) for removing the incompletely reacted materials. Therefore, this method has a problem from the standpoint of production efficiency, cost, etc.

The method described in Patent Literature 5 also has a problem in that it generates incompletely reacted materials such as oligomers of silane alkoxide which do not grow to silica particles which are intended to be produced. The concentration of silica particles in a dispersion liquid of silica particles produced is also very low. In addition, a particle in which five or more primary particles are linked to each other is spherical and is not chain-shaped (paragraph [0011]).

The methods described in Patent Literatures 6 and 7 also have a problem in that it generates incompletely reacted materials such as oligomers of silane alkoxide which do not grow to silica particles which are intended to be produced. In addition, the method described in Patent Literature 7 is a special method using a condensate of silane alkoxide as a raw material.

The present invention provides a method for efficiently producing a dispersion liquid of irregular-shaped silica particles in which primary particles are linked to each other, comprising suppressing the generation of incompletely reacted materials such as oligomers which do not grow to silica particles which are intended to be produced.

Solution to Problem

The irregular-shaped silica particles in which primary particles are linked to (coalesce with) each other can be efficiently produced by forming many primary particles having an active surface and bringing them into efficient contact with each other to cause them to coalesce with each other, in the initial stage of the reaction. That is, the concentration of active silica particles (primary particles) in the system can be rapidly increased during the period in the initial stage of the reaction by reducing the amount of a liquid I provided in advance in a container to increase the silane alkoxide concentration in the system during the initial stage of the reaction. This can promote coalescence of the primary particles to efficiently produce irregular-shaped silica particles in which two or more primary particles are linked to each other.

In addition, the amounts of water and an alkali catalyst which greatly affect hydrolysis of silane alkoxide are kept substantially constant relative to the silane alkoxide during the reaction period, by adding a liquid A containing the silane alkoxide and a liquid B containing the alkali catalyst and water to a liquid I containing no water nor alkali catalyst to cause the reaction to proceed. As a result, the silane alkoxide which is sequentially added is always hydrolyzed under the same conditions, and the generation of incompletely reacted materials such as oligomers which do not grow to silica particles which are intended to be produced is thus suppressed.

Specifically, the method of the present invention comprises a step of providing a liquid I consisting substantially of an organic solvent; and a step of adding simultaneously a liquid A containing silane alkoxide and a liquid B containing an alkali catalyst and water to the liquid I, to cause hydrolysis and polycondensation of the silane alkoxide, so as to produce a liquid dispersion containing irregular-shaped silica particles in which two or more primary particles are linked to each other. At this time, a period from the start of the addition (the start of the reaction) until the silica concentration reaches 70% of the silica concentration in the reaction system at the end of the addition (at the end of the reaction) is 20% or less of the total addition period (the total reaction period).

The amount of the liquid I is preferably 30% by mass or less relative to the total addition amount of the liquid A and the liquid B. It is also preferred that during a period from the start of the addition (the start of the reaction) to the end of the addition, the variation rate of the mole ratio of the alkali catalyst to silane alkoxide in the reaction system relative to the initial mole ratio is 0.90 to 1.10 and the variation rate of the mole ratio of water to silane alkoxide in the reaction system relative to the initial mole ratio is 0.90 to 1.10. It is further preferred that during a period from the start of the addition (the start of the reaction) to the end of the addition, the mole ratio of the alkali catalyst to silane alkoxide in the reaction system is always 0.20 or more and the mole ratio of water to silane alkoxide is always 2.0 or more. The temperature in the reaction system is preferably 0 to 65° C. The silica concentration in the reaction system at the end of the addition (at the end of the reaction) is preferably 5% by mass or more.

The dispersion liquid of silica particles comprises 10% or more of irregular-shaped silica particles in which two or more primary particles having an average particle diameter (d) of 5 to 300 nm are linked to each other, and a content of incompletely reacted materials therein is 200 ppm or less.

In the dispersion liquid of silica particles, the silica particle has preferably a content of each of U and Th of less than 0.3 ppb, a content of each of alkali metals, alkali earth metals, Fe, Ti, Zn, Pd, Ag, Mn, Co, Mo, Sn, Al, and Zr of less than 0.1 ppm, and a content of each of Cu, Ni, and Cr of less than 1 ppb.

Advantageous Effect of Invention

The method of the present invention can efficiently produce a dispersion liquid containing irregular-shaped silica particles in which primary particles are linked to each other, comprising suppressing the generation of incompletely reacted materials such as oligomers which do not grow to silica particles which are intended to be produced.

BRIEF DESCRIPTION OF DRAWINGS

FIG. 1 shows diagrams illustrating a method for calculating the average particle diameter (d) in the present invention, wherein each solid black area represents an interparticle junction part, and each interparticle junction part may include a space.

FIG. 2 is a graph showing the chronological change in the variation rate of catalyst proportion and the variation rate of water proportion in Example 1.

FIG. 3 is a graph showing the change in the silica concentration in the system in Example 1.

FIG. 4 is a graph showing the chronological change in the variation rate of catalyst proportion and the variation rate of water proportion in Example 2.

FIG. 5 is a graph showing the change in the silica concentration in the system in Example 2.

FIG. 6 is a graph showing the chronological change in the variation rate of catalyst proportion and the variation rate of water proportion in Example 3.

FIG. 7 is a graph showing the change in the silica concentration in the system in Example 3.

FIG. 8 is a graph showing the chronological change in the variation rate of catalyst proportion and the variation rate of water proportion in Example 4.

FIG. 9 is a graph showing the change in the silica concentration in the system in Example 4.

FIG. 10 is a graph showing the chronological change in the variation rate of catalyst proportion and the variation rate of water proportion in Comparative Example 1.

FIG. 11 is a graph showing the change in the silica concentration in the system in Comparative Example 1.

DESCRIPTION OF EMBODIMENTS

[Method for Producing Dispersion Liquid of Silica Particles]

The method for producing a dispersion liquid of silica particles of the present invention comprises: a step of providing a liquid I consisting substantially of an organic solvent; and a step of adding simultaneously a liquid A containing silane alkoxide and a liquid B containing an alkali catalyst and water to the liquid I, to cause hydrolysis and polycondensation of the silane alkoxide, so as to produce a liquid dispersion containing irregular-shaped silica particles in which two or more primary particles are linked to each other. At this time, a period from the start of the addition (the start of the reaction) until the silica concentration reaches 70% of the silica concentration in the reaction system (dispersion liquid) at the end of the addition (at the end of the reaction) is 20% or less of the total addition period (the total reaction period).

This rapidly increases the concentration of active silica particles (primary particles) in the system during the initial stage of reaction and thereby promotes aggressive coalescence of the primary particles. Therefore, irregular-shaped silica particles in which primary particles coalesce with each other can be efficiently produced.

The period from the start of the addition (the start of the reaction) until the silica concentration reaches 70% of the silica concentration in the system at the end of the addition (at the end of the reaction) is preferably 15% or less of the total addition period (the total reaction period).

The expression "the irregular-shaped silica particles in which two or more primary particles are linked to each other" as used herein refers to a chain-shaped particle in which two or more, preferably two to ten particles (primary particles) identified as one spherical or truly spherical particle are linked with each other (see FIG. 1).

The silica concentration in the system is obtained as follows: a sample is taken every 10 minutes, 5 g of each sample is dried at 1000° C. for 1 hour, and the silica concentration in the system is obtained from the mass before and after drying according to the following equation.

Silica concentration in system (% by mass)=(mass after drying/mass before drying)×100

Examples of the method by which a period from the start of an addition (the start of a reaction) until the silica concentration reaches 70% of the silica concentration in the system at the end of the addition (at the end of the reaction) is made 20% or less of the total addition period (the total reaction period) include a method for reducing the amount of a liquid I, and a method of increasing the concentration of the silane alkoxide to be added and the addition speed of silane alkoxide during the initial stage of the reaction.

<Liquid I (Liquid Provided in Advance in Container)>

A liquid I consists substantially of an organic solvent. Examples of the organic solvent include an alcohol, a ketone, an ether, a glycol and an ester. Among them, an alcohol is preferred in that it easily diffuses silane alkoxide and can allow hydrolysis to proceed uniformly and rapidly. More particularly, alcohols such as methanol, ethanol, propanol, and butanol; ketones such as methyl ethyl ketone and methyl isobutyl ketone; glycol ethers such as methyl cellosolve, ethyl cellosolve, and propylene glycol monopropyl ether; glycols such as ethylene glycol, propylene glycol, and hexylene glycol; and esters such as methyl acetate, ethyl acetate, methyl lactate, and ethyl lactate can be exemplified. Among them, methanol or ethanol is more preferred, and methanol is particularly preferred. These organic solvents may be used alone or as a mixture of two or more.

The expression "consist(ing) substantially of an organic solvent" used herein means that the inevitably contained impurities or the like derived from the process of producing the organic solvent can be contained but the other impurities or the like are not contained. For example, the content of the organic solvent is 99% by mass or more, and preferably 99.5% by mass or more.

The amount of the liquid I is preferably 30% by mass or less, more preferably 15% by mass or less and still more preferably 0.1 to 10% by mass relative to the total addition amount of the liquid A and the liquid B. By using a small amount of the liquid I, the concentration of active silica particles (primary particles) in the system can be rapidly increased during the initial period of the reaction, and coalescence of primary particles is promoted.

In a conventional reaction system, in which an alkali catalyst and water are placed in a liquid I, the composition in the system changes sequentially from the start of an addition (the start of a reaction). Therefore, hydrolysis conditions of silane alkoxide are not constant, and incompletely reacted materials tend to generate. Further, the pH in the system is high at the start of the addition (the start of the reaction) but tends to decrease thereafter, and when the amount of the alkali catalyst to be added is insufficient, the pH often becomes below 11 at the end of the addition (the end of the reaction) and incompletely reacted materials tend to generate.

In contrast, according to the present invention, since a liquid I consisting substantially of an organic solvent is used, the amounts of an alkali catalyst and water relative to silane alkoxide can be made constant during a reaction period from the start of an addition (start of a reaction) to the end of the addition. As a result, the silane alkoxide which is sequentially added is always hydrolyzed under the same conditions, and the generation of incompletely reacted materials such as oligomers which do not grow to silica particles which are intended to be produced is thus suppressed. In addition, particles with a uniform primary particle diameter can be produced.

<Liquid A>

The liquid A contains silane alkoxide, and preferably further contains an organic solvent. Typically, it is substantially consisted of silane alkoxide, or substantially consisted of two components, i.e. silane alkoxide and an organic solvent. In a similar manner as described above, the expressions "substantially consist(ing) of silane alkoxide" and "substantially consist(ing) of two components" used herein mean that the inevitably contained impurities or the like derived from the process of generating the silane alkoxide or the organic solvent can be contained but other impurities or the like are not contained, and the content of the organic solvent or the content of silane alkoxide and the organic solvent is 99% by mass or more, and preferably 99.5% by mass or more.

Examples of the silane alkoxide include silane alkoxides represented by the following formula [1].

$$X_nSi(OR)_{4-n} \quad [1]$$

In the formula, X represents a hydrogen atom, a fluorine atom, an alkyl group having 1 to 8 carbon atoms, an aryl group, or a vinyl group; R represents a hydrogen atom, an alkyl group having 1 to 8 carbon atoms, an aryl group, or a vinyl group; and n is an integer of 0 to 3.

Examples of the silane alkoxide represented by the formula [1] other than tetramethoxysilane and tetraethoxysilane include tetraisopropoxysilane, tetrabutoxysilane, tetoraoctoxysilane, methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trimethylmethoxysilane, trimethylethoxysilane, trimethylisopropoxysilane, trimethylbutoxysilane trifluoromethyltrimethoxysilane, and trifluoromethyltriethoxysilane.

Among these silane alkoxides, those represented by the formula [1] wherein n is 0 and the alkyl chain of R is short, such as tetramethoxysilane (TMOS) and tetraethoxysilane (TEOS), are particularly preferably used. When these are used, the hydrolysis speed tends to be high, the initial concentration of the silica particle can be rapidly increased, and the incompletely reacted materials tend not to remain. Among them, tetramethoxysilane (TMOS) having a short alkyl chain is preferred.

The organic solvent of the liquid A to be used can be the organic solvents exemplified as the liquid I, but the organic solvent having the same composition as the liquid I is preferably used. That is, when methanol is used in the liquid I, methanol is also preferably used in the liquid A.

When the liquid A contains an organic solvent, the concentration of silane alkoxide relative to the organic solvent is, for example, 1.5 to 6.4 mol/L, and preferably 2.0 to 6.0 mol/L.

<Liquid B>

The liquid B contains an alkali catalyst and water, and usually consists substantially of two components. The expression "consist(ing) substantially of two components" used herein have the same meaning as described above regarding the liquid A.

Examples of the alkali catalyst to be used include compounds showing basic properties, such as ammonia, an amine, an alkali metal hydride, an alkali earth metal hydride, alkali metal hydroxide, an alkali earth metal hydroxide, a quaternary ammonium compound, and an amine-based coupling agent, with ammonia being preferred.

Here, the concentration of the alkali catalyst relative to water is, for example, 1 to 24 mol/L, and preferably 3 to 15 mol/L.

<Reaction Conditions, Etc.>

The method for producing a dispersion liquid of silica particles preferably satisfies the following two conditions:

(1) the variation rate of the mole ratio of the alkali catalyst to silane alkoxide in the reaction system during a period from a start to an end of an addition of the liquids A and B (a period from the start of the addition (start of the reaction) to the end of the addition) relative to the initial mole ratio (variation rate of catalyst proportion) is 0.90 to 1.10; and (2) the variation rate of the mole ratio of water to silane alkoxide in the reaction system during a period from a start to an end of an addition of the liquids A and B (a period from the start of the addition (start of the reaction) to the end of the addition) relative to the initial mole ratio (variation rate of water proportion) is 0.90 to 1.10.

Specifically, it is a method in which the variation rate of catalyst proportion and the variation rate of water proportion during a period from the start of the addition (start of the reaction) to the end of the addition are intended to be reduced as much as possible and to keep the variation rates constant. The specific embodiments include a method for suppressing the variation rate of catalyst proportion and the variation rate of water proportion by keeping the amounts of the alkali catalyst and water contained in the liquid I as low as possible, as described above. The embodiments also include a method of suppressing the variation rate of catalyst proportion and the variation rate of water proportion by keeping the addition conditions such as addition speed of the liquid A and the liquid B as constant as possible during a period from the start of the addition (the start of the reaction) to the end of the addition. For example, the changes in the addition speed of the liquid A and the liquid B can be suppressed by using a highly accurate pump.

As a result, the silane alkoxide which is sequentially added is always hydrolyzed under the same conditions, and the generation of incompletely reacted materials such as oligomers which do not grow to silica particles which are intended to be produced is thus suppressed. This makes it possible to eliminate a step of removing incompletely reacted materials and thus to efficiently produce a dispersion liquid of silica particles. The produced dispersion liquid of silica particles contains almost no incompletely reacted materials such as oligomers. Therefore, it can provide an abrasive having an excellent stability as a dispersion liquid of silica particles and an abrasive, and having a good abrasive property. In addition, particles with a uniform primary particle diameter can be produced.

Each of the mole ratio of an alkali catalyst to silane alkoxide (alkali catalyst/silane alkoxide) and the mole ratio of water to silane alkoxide (water/silane alkoxide) as used herein refers to the mole ratio calculated based on the actual measured addition weights, assuming that the hydrolysis and polycondensation reactions of silane alkoxide take place instantaneously and the alkali catalyst is not released out of the system. Each of the variation rate of catalyst proportion and the variation rate of water proportion is calculated from the numerical value obtained by calculating the mole ratio from the actual measured addition weights at the predetermined time intervals (for example, every 10 minutes) and dividing the calculated value by the initial mole ratio. The initial value refers to the mole ratio (theoretical value) immediately after addition of the liquid A and the liquid B.

The variation rate of catalyst proportion is preferably 0.90 to 1.10 as described above, more preferably 0.95 to 1.05, and still more preferably 0.98 to 1.02.

The variation rate of water proportion is preferably 0.90 to 1.10 as described above, more preferably 0.95 to 1.05, and still more preferably 0.98 to 1.02.

Also, the addition speed of silane alkoxide during a period from the start of the addition (the start of the reaction) to the end of the addition is preferably 0.005 mol/min or more, more preferably 0.01 mol/min or more, and still preferably 0.02 mol/min or more. The addition of silane alkoxide at such a speed can suppress the generation of incompletely reacted materials such as oligomers of silane alkoxide which do not grow to silica particles which are intended to be produced. It can form many primary particles having an active surface and bring the primary particles into contact with each other to cause them to coalesce with each other, in the initial stage of the reaction as well as can cause the particle, generated by the coalescence, as a seed particle to further grow.

Further, it is preferred that during a period from the start of the addition (the start of the reaction) to the end of the addition, the mole ratio of an alkali catalyst to silane alkoxide in the reaction system is always 0.20 or more and the mole ratio of water to silane alkoxide is always 2.0 or more. That is, it is preferred that, during the addition (during the reaction), each of the amounts of the alkali catalyst and water relative to the amount of silane alkoxide are kept at a predetermined value or more. By subjecting to the reaction the alkali catalyst and water the amounts of which are kept at the predetermined value or more relative to the amount of silane alkoxide, it is possible to allow hydrolysis to sufficiently proceed, and suppress a remain of unreacted silane alkoxide and a generation of incompletely reacted materials.

Each of the mole ratio of the alkali catalyst to silane alkoxide and the mole ratio of water to silane alkoxide refers to the mole ratio calculated based on the actual measured addition weights as described above.

As described above, the mole ratio of the alkali catalyst to silane alkoxide in the reaction system during a period from the start of the addition (the start of the reaction) to the end of the addition is preferably 0.20 or more, more preferably 0.30 or more, and still more preferably 0.50 to 1.00.

Also, as described above, the mole ratio of water to silane alkoxide in the reaction system during a period from the start of the addition (the start of the reaction) to the end of the addition is preferably 2.0 or more, more preferably 3.0 or more, and still more preferably 3.5 to 15.0.

Further, the pH in the reaction system at the end of the addition (the end of the reaction) is preferably 11 or more, and more preferably 11.2 or more. In a conventional reaction system in which an alkali catalyst is placed in a liquid I, the pH in the system is often below 11 at the end of the reaction, which is a cause of the generation of the incompletely reacted materials. However, according to the present invention, as described above, the pH at the end of the reaction can be 11 or more by adding the alkali catalyst and water the amounts of which are kept constant relative to the amount of silane alkoxide.

The reaction is usually performed under atmospheric pressure. The reaction temperature may be any temperature equal to or lower than the boiling point of the solvent to be used, but it is preferably 0 to 65° C. and more preferably 10 to 50° C. to promote deposition of particles.

The dispersion liquid of silica particles produced by the production method according to the present invention has less incompletely reacted materials such as oligomers of silane alkoxide. Therefore, it is not always necessary to perform heat-aging treatment, heat removal treatment, and purification treatment such as ultrafiltration, which have been conventionally performed.

The silica concentration in the dispersion liquid of silica particles (reaction system) at the end of the addition (at the end of the reaction) is higher than that in the dispersion liquid produced by a conventional method and is, for example, 5% by mass or more, preferably 10% by mass or more, and more preferably 10 to 25% by mass.

[Dispersion Liquid of Silica Particles]

The dispersion liquid of silica particles according to the present invention comprises 10% or more of irregular-shaped silica particles in which two or more primary particles having an average particle diameter (d) of 5 to 300 nm are linked to each other and a content of incompletely reacted materials therein is 200 ppm or less. The dispersion liquid of silica particles can be produced by the above-described production method. The dispersion liquid of silica particles is useful as an abrasive, and may be used as it is or in a dried state.

<Incompletely Reacted Materials>

The incompletely reacted materials refer to silicon-containing compounds for which the reaction has not proceeded to provide the intended silica particles. They are, for example, unreacted raw material silane alkoxide, its hydrolyzates (oligomers) having a low molecular weight, much smaller particles than particles which are intended to be produced, and the like. Specifically it refers to silicon-containing compounds present in a supernatant obtained when centrifuging an aqueous dispersion liquid of silica particles at 10° C., 1,370,000 rpm (1,000,000 G) for 30 minutes with CS150GXL, a micro ultracentrifuge manufactured by Hitachi Koki Co., Ltd.

<<Measurement Method of Content of Incompletely Reacted Materials>>

For the silicon-containing compounds (incompletely reacted materials) present in the above supernatant, the $SiO_2$ concentrations are obtained from Si measured with ICP emission spectrometer ICPS-8100 manufactured by Shimadzu Corporation.

Since the dispersion liquid of silica particles is almost free from incompletely reacted materials such as oligomers, when used in an abrasive, it has excellent particle stability and deposits on substrate are decreased. The adsorption of and reaction with various chemicals added to the abrasives can be suppressed by these advantages, and these advantages can exert effects of the chemicals more effectively.

The silica particles contained in the dispersion liquid of silica particles form a three-dimensional polycondensation structure. This is due to the fact that hydrolysis and polycondensation of silane alkoxide t occurring in an alkaline environment proceed not only in a planar state (in a two-dimensional manner) but also in a cubic manner (in a three-dimensional manner). An abrasive using a particle having such a structure is suitable because it has a high particle dispersibility and provides a sufficient polishing speed. On the other hand, hydrolysis and polycondensation of the silane alkoxide occurring in an acidic environment proceed in a two-dimensional manner, and hence a spherical particle cannot be obtained.

The structure can be determined by the presence of a particle observed with a transmission electron microscope or a scanning electron microscope.

The average particle diameter (d) of a primary silica particle contained in the dispersion liquid of silica particles is 5 to 300 nm, and can be appropriately set in accordance with a required polishing speed, polishing precision, and so on. The method for calculating an average particle diameter (d) is described with reference to FIG. 1. FIG. 1 illustrates a particle in which a primary particle is present alone and a particle in which a plurality of primary particles are linked to each other, wherein each solid black area represents an interparticle junction part and each interparticle junction part may include a space. The particle diameter d is the longest diameter measured for the primary particle contained in each particle. The average particle diameter (d) is determined as follows: an electron micrograph of a silica particle is taken and 100 particles are arbitrarily selected therefrom; the longest diameter d of the primary particle is measured for each of the 100 particles; and the average value is used as the average particle diameter (d).

When the average particle diameter is smaller than 5 nm, the dispersion liquid of silica particles tends to have insufficient stability, and the particle diameter is too small to achieve a sufficient polishing speed. When the average particle diameter is larger than 300 nm, scratches are likely to generate and insufficient smoothness is not obtained in some cases when the silica particle is used as an abrasive, although depending on the types of substrate or insulating film. The average particle diameter is preferably 10 to 200 nm, and more preferably 15 to 100 nm.

The dispersion liquid of silica particles comprises 10% of more, preferably 30% or more and more preferably 50% or more of irregular-shaped silica particles in which two or more primary particles having the above-described average particle diameter (d) of 5 to 300 nm are linked to each other. The irregular-shaped silica particle is not particularly limited as long as it is one in which two or more primary particles are linked to each other, but it is preferably one in which about two to ten particles are linked to each other.

The number of the linked primary particles in the irregular-shaped silica particle and the proportion of the irregular-shaped silica particle in the system (irregular-shaped particle proportion) is determined by taking an electron micrograph of the irregular-shaped silica particles and observing 100 particles arbitrarily selected therefrom.

It is preferred that, the silica particle contained in the dispersion liquid of silica particles includes a content of each of U and Th of less than 0.3 ppb, a content of each of alkali metals, alkali earth metals, Fe, Ti, Zn, Pd, Ag, Mn, Co, Mo, Sn, Al, and Zr of less than 0.1 ppm, and a content of each of Cu, Ni, and Cr of less than 1 ppb. If within this range, the silica-based particle can be used as an abrasive grain for highly integrated logics and memories with a wiring node of 40 nm or less, and for three-dimensional implementation.

When the metal elements as impurity components are present in quantities larger than the above-mentioned ranges, the metal elements may remain on a substrate polished with the silica particle. The metal elements cause insulation failure to a circuit formed on a semiconductor substrate or short the circuit. This may decrease the dielectric constant of a film for insulation (insulating film) and increase the impedance of the metal wiring, leading to lowering of the response speed, increase of the power consumption, and so on. In addition, the metal element ions may migrate (diffuse), and such failures may be caused under some conditions for use or after a long-term use. In particular, U and Th generate radiation to cause malfunctions to a semiconductor device even when the amount of remaining U or Th is minute.

Here, the alkali metal refers to Li, Na, K, Rb, Cs, or Fr. The alkali earth metal refers to Be, Mg, Ca, Sr, Ba, or Ra.

To obtain such a highly-pure silica particle with a small content of impurity components, it is preferred to use an apparatus the material of which is free of such elements and has high chemical resistance, in preparation of the particle. Specific preferred examples of the material include plastics such as Teflon (R), FRP, and carbon fibers, and non-alkali glass.

In addition, it is preferred to purify raw materials to be used by distillation, ion exchange, or removal with a filter. In particular, alcohol used in hydrolysis of alkoxide, may be contaminated with metal impurity components from a tank and so on or with a catalyst during synthesis, and may require purification at a particularly high level.

As a method to obtain a highly-pure silica particle, it is possible to provide raw materials with a small content of impurity components in advance, or preventing contamination from an apparatus for particle preparation, as described above. Alternatively, it is possible to reduce impurity components for a particle prepared without sufficiently taking such countermeasures. However, as impurity components are incorporated in the silica particle, purification using ion exchange or removal with a filter would be inefficient, and high cost may be required. Thus, it is not practical for obtaining a silica particle with a small content of impurity components with such a method.

<<Measurement of Contents of Metal Elements>>

To determine the content of U and Th, the contents of alkali metals, alkali earth metals, Fe, Ti, Zn, Pd, Ag, Mn, Co, Mo, Sn, Al, and Zr, and the contents of Cu, Ni, and Cr in the silica particle, the silica particle is dissolved in hydrofluoric acid, and heated to remove the hydrofluoric acid and then added with pure water as necessary, and the resulting solution is subjected to measurement with an inductively coupled plasma (ICP) emission mass spectrometer (for example, ICPM-8500 manufactured by Shimadzu Corporation).

EXAMPLES

Hereinafter, the present invention will be described with reference to Examples. However, the present invention shall be not limited to these Examples.

Example 1

<Production of Dispersion Liquid of Silica Particles (SA)>

300.0 g of methanol (liquid I) was kept at 50° C., and 2994.4 g of a methanol solution of tetramethoxysilane (liquid A) (manufactured by Tama Chemicals Co., Ltd. (the same applies hereinafter)) and 800.0 g of aqueous ammonia (liquid B) were simultaneously added to the liquid I over 5 hours. The silica concentration in the dispersion liquid of silica particles at the end of the reaction end was 14.2% by mass. After completion of the addition, the mixture was further aged at the same temperature for 1 hour. The solvent was substituted with pure water to obtain a dispersion liquid of silica particles (SA) having a silica concentration of 20% by mass. Detailed processing conditions and results of various measurements are shown in Table 1. The chronological changes in the variation rate of catalyst proportion and the variation rate of water proportion are shown in FIG. 2. The change in the silica concentration in the system is shown in FIG. 3.

<<Mole Ratios of Alkali Catalyst and Water to Silane Alkoxide, and Variation Rates of the Mole Ratio>>

Each of the mole ratios of "alkali catalyst/silane alkoxide" and "water/silane alkoxide" was calculated based on the actual measured addition weights, assuming that the hydrolysis and polycondensation reactions of silane alkoxide take place instantaneously and the alkali catalyst is not released out of the system. Each of mole ratios in the reaction system was calculated from 10 minutes after the start of the addition of the liquids A and B and every 10 minutes thereafter. The variations of the mole ratios of each substance in the reaction system were compared by using the numerical values obtained by dividing the mole ratios by the mole ratios (theoretical values) immediately after the addition of the liquid A and the liquid B as the initial values.

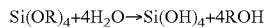

(4 mol consumed during hydrolysis)

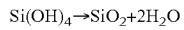

(2 mol released during polycondensation)

<<Silica Concentration in System>>

The sample was collected every 10 minutes, 5 g of each sample was dried at 1000° C. for 1 hour, and the silica concentration in the system was calculated from the mass before and after drying according to the following equation.

Silica concentration in system (% by mass)=(mass after drying/mass before drying)×100

<<Amounts of Incompletely Reacted Materials>>

For the amounts of incompletely reacted materials, silicon-containing compounds (incompletely reacted materials) present in a supernatant obtained when centrifuging the above-obtained dispersion liquid of silica particles having a silica concentration of 20% by mass at 10° C., 1,370,000 rpm (1,000,000 G) for 30 minutes with CS150GXL micro ultracentrifuge manufactured by Hitachi Koki Co., Ltd. were subjected to ICP emission spectrometer ICPS-8100 manufactured by Shimadzu Corporation to measure the Si contents, and the comparison was performed with the $SiO_2$ concentrations calculated from the Si contents.

<<Average Particle Diameter of Primary Particles>>

The average particle diameter of primary particles was determined as follows: an electron micrograph of silica particles was taken and 100 particles were arbitrarily selected therefrom; the longest diameter of the primary particle (sometimes, in a short diameter direction of a chain-shaped particle) was measured for each of the 100 particles as illustrated in FIG. 1; and the average value was used as the average particle diameter.

<<CV Value of Primary Particle Diameter>>

The CV value of the primary particle diameter was determined by calculation from each of the above results.

<<Proportion of Irregular-Shaped Silica Particle in System (Irregular-Shaped Particle Proportion)>>

The proportion of irregular-shaped silica particles in the system in which two or more primary particles are linked to each other was determined by taking an electron micrograph of the particles and observing 100 particles arbitrarily selected therefrom.

<<Number of Linked Primary Particles in Irregular-Shaped Silica Particle>>

The average number of linked primary particles in the irregular-shaped silica particle was determined by taking an electron micrograph of the irregular-shaped silica particles and observing 100 particles arbitrarily selected therefrom.

<Production of Abrasive (SA)>

An abrasive (SA) containing 3.0% by mass of the silica particles produced in Example 1, 175 ppm of hydroxyethyl cellulose (HEC), and 225 ppm of ammonia was prepared.

<<Stability Test of Abrasive (Slurry)>>

The stability of the abrasive (slurry) was evaluated by the presence or absence of white turbidity in the abrasive (SA) prepared in the above <Production of abrasive (SA)>. The results are shown in Table 1.

White turbidity was absent: Good
White turbidity was present: Poor

<<Polishing Test>>

The substrate for polishing (a single crystal silicon wafer having a crystal structure of 1.0.0) was set in a polishing machine (NF300, manufactured by Nano Factor Co., Ltd.), and polished for 10 minutes by use of a polishing pad SUBA600 with a load of 15 kPa applied to the substrate at a table rotation speed of 50 rpm, and a spindle speed of 60 rpm while the abrasive (SA) was fed at a speed of 250 mL/min. Thereafter, the substrate was washed with pure water and air-dried.

Then, the polished surface of the resulting polished substrate was observed, and the smoothness of the surface was evaluated by using the following criteria (degree of scratches). The results are shown in Table 1.

Almost no scratch was found: Good
A few scratches were found: Fair
Scratches were found over a wide area: Poor For silica components remaining on the polished substrate, the degree of remaining was observed by using a laser microscope (VK-X250, manufactured by KEYENCE CORPORATION), and evaluated by using the following criteria. The results are shown in Table 1.

Almost no silica component remained: Good
A few silica components remained: Fair
Silica components remained over a wide area: Poor Example 2

<Production of Dispersion Liquid of Silica Particles (SB)>

206.0 g of methanol (liquid I) was kept at 25° C., and 2003.3 g of a methanol solution of tetramethoxysilane (liquid A) and 784.0 g of aqueous ammonia (liquid B) were simultaneously added to the liquid I over 10 hours. The silica concentration in the dispersion liquid of silica particles at the end of the reaction was 12.9% by mass. After completion of the addition, the mixture was further aged at the same temperature for 1 hour. The solvent was substituted with pure water to obtain a dispersion liquid of silica particles (SB) having a silica concentration of 20% by mass. Detailed processing conditions and results of various measurements are shown in Table 1. The chronological changes in the variation rate of catalyst proportion and the variation rate of water proportion are shown in FIG. 4. The change in the silica concentration in the system is shown in FIG. 5.

An abrasive (SB) was produced in the same manner as in Example 1 except that the dispersion liquid of silica particles (SB) was used, and a stability test and a polishing test were performed in the same manner as in Example 1. The results are shown in Table 1.

Example 3

<Production of Dispersion Liquid of Silica Particles (SC)>

150.0 g of methanol (liquid I) was kept at 60° C., and 2994.4 g of a methanol solution of tetramethoxysilane (liquid A) and 800.0 g of aqueous ammonia (liquid B) were simultaneously added to the liquid I over 5 hours. The silica concentration in the dispersion liquid of silica particles at the end of the reaction was 14.7% by mass. After completion of the addition, the mixture was further aged at the same temperature for 1 hour. The solvent was substituted with pure water to obtain a dispersion liquid of silica particles (SC) having a silica concentration of 20% by mass. Detailed processing conditions and results of various measurements are shown in Table 1. The chronological changes in the variation rate of catalyst proportion and the variation rate of water proportion are shown in FIG. 6. The change in the silica concentration in the system is shown in FIG. 7.

An abrasive (SC) was produced in the same manner as in Example 1 except that the dispersion liquid of silica particles (SC) was used, and a stability test and a polishing test were performed in the same manner as in Example 1. The results are shown in Table 1.

Example 4

<Production of Dispersion Liquid of Silica Particles (SD)>

500.0 g of methanol (liquid I) was kept at 40° C., and 2794.4 g of a methanol solution of tetramethoxysilane (liquid A) and 800.0 g of aqueous ammonia (liquid B) were simultaneously added to the liquid I over 8 hours and 20 minutes (500 minutes). The silica concentration in the dispersion liquid of silica particles at the end of the reaction was 14.2% by mass. After completion of the addition, the mixture was further aged at the same temperature for 1 hour. The solvent was substituted with pure water to obtain a dispersion liquid of silica particles (SD) having a silica concentration of 20% by mass. Detailed processing conditions and results of various measurements are shown in Table 1. The chronological changes in the variation rate of catalyst proportion and the variation rate of water proportion are shown in FIG. 8. The change in the silica concentration in the system is shown in FIG. 9.

An abrasive (SD) was produced in the same manner as in Example 1 except that the dispersion liquid of silica particles (SD) was used, and a stability test and a polishing test were performed in the same manner as in Example 1. The results are shown in Table 1.

Comparative Example 1

<Production of Dispersion Liquid of Silica Particles (RA)>

A liquid I consisting of 2268.0 g of methanol, 337.5 g of pure water, and 94.5 g of 29% aqueous ammonia was kept at 40° C., and 2170.0 g of a methanol solution of tetramethoxysilane (liquid A) was added to the liquid I over 160 minutes. The silica concentration in the dispersion liquid of silica particles at the end of the reaction was 14.0% by mass. After completion of the addition, the mixture was further aged at the same temperature for 1 hour. The solvent was substituted with pure water to obtain a dispersion liquid of silica particles (RA) having a silica concentration of 20% by mass. Detailed processing conditions and results of various measurements are shown in Table 1. The chronological changes in the variation rate of catalyst proportion and the variation rate of water proportion are shown in FIG. 10. The change in the silica concentration in the system is shown in FIG. 11.

An abrasive (RA) was produced in the same manner as in Example 1 except that the dispersion liquid of silica particles (RA) was used, and a stability test and a polishing test were performed in the same manner as in Example 1. The results are shown in Table 1.

In any of the Examples and the Comparative Example, the silica particle included a content of each of U and Th of less than 0.3 ppb, a content of each of alkali metals, alkali earth metals, Fe, Ti, Zn, Pd, Ag, Mn, Co, Mo, Sn, Al, and Zr of less than 0.1 ppm, and a content of each of Cu, Ni, and Cr of less than 1 ppb.

<<Contents of Metal Elements>>

The silica particles were dissolved in hydrofluoric acid, and heated to remove the hydrofluoric acid, and then added with pure water as necessary, and the resulting solution was subjected to measurement with an inductively coupled plasma (ICP) emission mass spectrometer (e.g., ICPM-8500, manufactured by Shimadzu Corporation) to determine the contents of metal elements in the silica particle.

TABLE 1

|  |  | Example1 | Example2 | Example3 | Example4 | Comparative Example1 |
|---|---|---|---|---|---|---|
| Liquid I | Methanol (g) | 300 | 206 | 150 | 500 | 2268.0 |
|  | Pure water (g) | — | — | — | — | 337.5 |
|  | 29% Aqueous ammonia (g) | — | — | — | — | 94.5 |
| Liquid A | Tetramethoxysilane (g) | 1464.4 | 976.3 | 1464.4 | 1464.4 | 1733.2 |
|  | Methanol (g) | 1530.0 | 1027.0 | 1530.0 | 1330.0 | 436.8 |
| Liquid B | Pure water (g) | 460.0 | 672.0 | 460.0 | 460.0 | — |
|  | 29% Aqueous ammonia (g) | 340.0 | 112.0 | 340.0 | 340.0 | — |
| Proportion of liquid I: {liquid I/(liquid A + liquid B)} × 100 |  | 7.9 | 7.4 | 4.0 | 13.9 | 120 |
| Initial mole ratio of alkali catalyst/silane alkoxide |  | 0.60 | 0.30 | 0.60 | 0.60 | 2.26 |
| Initial mole ratio of water/silane alkoxide |  | 2.04 | 4.50 | 2.04 | 2.04 | 29.5 |
| Alkali catalyst/silane alkoxide (variation rate to initial value) |  | 1.00 | 1.00 | 1.00 | 1.00 | 0.06-1.00 |
| Water/silane alkoxide (variation rate to initial value) |  | 1.00 | 1.00 | 1.00 | 1.00 | 0.00-1.00 |
| Hydrolysis temperature (° C.) |  | 50 | 25 | 60 | 40 | 40 |
| Addition time (minutes) |  | 300 | 600 | 300 | 500 | 160 |
| Aging temperature (° C.) |  | 50 | 25 | 60 | 40 | 40 |
| Aging time (hours) |  | 1 | 1 | 1 | 1 | 1 |
| pH at end of reaction |  | 11.2 | 11.1 | 11.2 | 11.1 | 10.3 |
| (Addition period until silica concentration reaches 70% of silica concentration at end of addition)/total addition period × 100 |  | 15 | 14 | 8 | 19 | 56 |
| Amount (ppm) of incompletely reacted materials |  | 100 | 110 | 100 | 120 | 350 |
| Average particle diameter of primary particle (nm) |  | 35 | 25 | 70 | 18 | 25 |
| CV value of primary particle diameter (%) |  | 3 | 5 | 3 | 5 | 20 |
| Irregular-shaped particle proportion (%) |  | 50 | 30 | 50 | 25 | 20 |

TABLE 1-continued

|  | Example1 | Example2 | Example3 | Example4 | Comparative Example1 |
|---|---|---|---|---|---|
| Number of linked particles | 2.5 | 1.7 | 2.5 | 1.5 | 1.2 |
| Slurry stability | Good | Good | Good | Good | Poor |
| Polishing property (scratches) | Good | Good | Good | Good | Poor |
| Polishing property (silica components remaining) | Good | Good | Good | Good | Poor |

It is shown from Table 1 that the dispersion liquid of silica particles produced in each of Examples 1 to 4 had an irregular-shaped silica particle efficiently produced. The dispersion liquid of silica particles had less incompletely reacted materials than that produced in Comparative Example 1 and also had excellent slurry stability and polishing property.

The invention claimed is:

1. A method for producing a dispersion liquid of silica particles, comprising:
   providing a liquid I consisting substantially of an organic solvent; and
   simultaneously adding a liquid A containing silane alkoxide and a liquid B containing an alkali catalyst and water to the liquid I to cause hydrolysis and polycondensation of the silane alkoxide, so as to produce a liquid dispersion containing an irregular-shaped silica particle in which two or more primary particles are linked to each other;
   wherein a period from a start of an addition until a silica concentration reaches 70% of a silica concentration in a reaction system at an end of the addition is 20% or less of a total addition period.

2. The method for producing a dispersion liquid of silica particles according to claim 1, wherein an amount of the liquid I is 30% by mass or less relative to a total addition amount of the liquid A and the liquid B.

3. The method for producing a dispersion liquid of silica particles according to claim 1, wherein
   a variation rate of a mole ratio of the alkali catalyst to the silane alkoxide in the reaction system during the period from the start to the end of the addition relative to an initial mole ratio of the alkali catalyst to the silane alkoxide is 0.90 to 1.10; and
   the variation rate of the mole ratio of the water to the silane alkoxide in the reaction system relative to the initial mole ratio of the water to the silane alkoxide is 0.90 to 1.10.

4. The method for producing a dispersion liquid of silica particles according to claim 1, wherein
   the mole ratio of the alkali catalyst to the silane alkoxide in the reaction system during the period from the start to the end of the addition is constantly 0.20 or more; and
   the mole ratio of the water to the silane alkoxide is constantly 2.0 or more.

5. The method for producing a dispersion liquid of silica particles according to claim 1, wherein a temperature of the reaction system is 0 to 65° C.

6. The method for producing a dispersion liquid of silica particles according to claim 1, wherein the silica concentration in the reaction system at the end of the addition is 5% by mass or more.

7. The method for producing a dispersion liquid of silica particles according to claim 2, wherein
   a variation rate of a mole ratio of the alkali catalyst to the silane alkoxide in the reaction system during the period from the start to the end of the addition relative to an initial mole ratio of the alkali catalyst to the silane alkoxide is 0.90 to 1.10; and
   the variation rate of the mole ratio of the water to the silane alkoxide in the reaction system relative to the initial mole ratio of the water to the silane alkoxide is 0.90 to 1.10.

8. The method for producing a dispersion liquid of silica particles according to claim 2, wherein
   the mole ratio of the alkali catalyst to the silane alkoxide in the reaction system during the period from the start to the end of the addition is constantly 0.20 or more; and
   the mole ratio of the water to the silane alkoxide is constantly 2.0 or more.

9. The method for producing a dispersion liquid of silica particles according to claim 3, wherein
   the mole ratio of the alkali catalyst to the silane alkoxide in the reaction system during the period from the start to the end of the addition is constantly 0.20 or more; and
   the mole ratio of the water to the silane alkoxide is constantly 2.0 or more.

10. The method for producing a dispersion liquid of silica particles according to claim 7, wherein
    the mole ratio of the alkali catalyst to the silane alkoxide in the reaction system during the period from the start to the end of the addition is constantly 0.20 or more; and
    the mole ratio of the water to the silane alkoxide is constantly 2.0 or more.

11. The method for producing a dispersion liquid of silica particles according to claim 2, wherein a temperature of the reaction system is 0 to 65° C.

12. The method for producing a dispersion liquid of silica particles according to claim 3, wherein a temperature of the reaction system is 0 to 65° C.

13. The method for producing a dispersion liquid of silica particles according to claim 4, wherein a temperature of the reaction system is 0 to 65° C.

14. The method for producing a dispersion liquid of silica particles according to claim 2, wherein the silica concentration in the reaction system at the end of the addition is 5% by mass or more.

15. The method for producing a dispersion liquid of silica particles according to claim 3, wherein the silica concentration in the reaction system at the end of the addition is 5% by mass or more.

16. The method for producing a dispersion liquid of silica particles according to claim 4, wherein the silica concentration in the reaction system at the end of the addition is 5% by mass or more.

17. The method for producing a dispersion liquid of silica particles according to claim 5, wherein the silica concentration in the reaction system at the end of the addition is 5% by mass or more.

* * * * *